United States Patent
Devine et al.

(10) Patent No.: US 8,066,815 B2
(45) Date of Patent: *Nov. 29, 2011

(54) MULTI-WORKPIECE PROCESSING CHAMBER

(75) Inventors: Daniel J. Devine, Los Gatos, CA (US); Rene George, San Jose, CA (US); Ce Qin, Fremont, CA (US); Dixit Desai, Pleasanton, CA (US)

(73) Assignee: Mattson Technology, Inc., Fremont, CA (US)

( * ) Notice: Subject to any disclaimer, the term of this patent is extended or adjusted under 35 U.S.C. 154(b) by 547 days.

This patent is subject to a terminal disclaimer.

(21) Appl. No.: 11/839,527

(22) Filed: Aug. 15, 2007

(65) Prior Publication Data

US 2007/0281085 A1 Dec. 6, 2007

Related U.S. Application Data

(63) Continuation of application No. 10/828,614, filed on Apr. 21, 2004, now Pat. No. 7,276,122.

(51) Int. Cl.
*C23C 16/00* (2006.01)
*C23F 1/00* (2006.01)
*H01L 21/306* (2006.01)

(52) U.S. Cl. .............. 118/719; 118/723 R; 156/345.31; 156/345.29

(58) Field of Classification Search ................. 118/719; 156/345.29, 345.31, 345.32
See application file for complete search history.

(56) References Cited

U.S. PATENT DOCUMENTS

| | | | |
|---|---|---|---|
| 3,785,853 A * | 1/1974 | Kirkman et al. | ......... 427/255.23 |
| 4,764,076 A | 8/1988 | Layman et al. | |
| 5,415,729 A | 5/1995 | Strasser et al. | |
| 5,441,615 A | 8/1995 | Mukai et al. | |
| 5,534,231 A | 7/1996 | Savas | |
| 5,639,309 A | 6/1997 | Akimoto | |
| 5,667,592 A | 9/1997 | Boitnott et al. | |
| 5,811,022 A | 9/1998 | Savas et al. | |
| 5,855,681 A | 1/1999 | Maydan et al. | |
| 5,883,017 A | 3/1999 | Tepman et al. | |
| 5,964,949 A | 10/1999 | Savas | |
| 6,495,233 B1 | 12/2002 | Shmurun et al. | |

OTHER PUBLICATIONS

Shiller et al; Robot Path Planning with Obstacles, Actuator, Gripper, and Payload Constraints; Dec. 1989; International Journal of Robotics Research, vol. 8, No. 6, pp. 3-18.

Shiller et al; Computation of Path Contained Time Optimal Motions with Dynamic Singularities; Mar. 1992; Transactions of the ASME, Journal of Dynamic Systems, Measurements, and Control, vol. 114, pp. 34-40.

Mattson Technology, Inc; Aspen CVD Performance Specifications.
Novellus, CVD Processing Brochure.

* cited by examiner

*Primary Examiner* — Karla Moore
(74) *Attorney, Agent, or Firm* — Pritzkau Patent Group, LLC

(57) ABSTRACT

A multi-workpiece chamber includes at least two processing stations, for exposing workpieces to a treatment process. A partition cooperates with the chamber such that the partition is disengagably removable from the chamber and re-engagable with the chamber for selectively dividing the processing stations. The partition is configured to provide for non-line-of-sight travel of certain ones of the process related products between the processing stations. An exhaust arrangement divides exhaust flow into at least two approximately equal exhaust flow portions that leave the multi-workpiece chamber in a way which enhances uniformity of the treatment process for the stations. A partition configuration is described including a partition portion between the stations and a baffle portion extending into an exhaust arrangement. A modified partition arrangement is provided for use in establishing a modified exchange characteristic of the process related products.

13 Claims, 10 Drawing Sheets

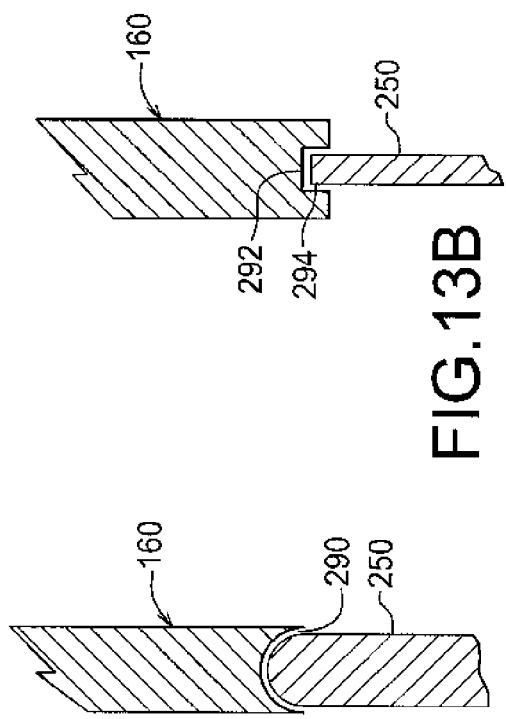
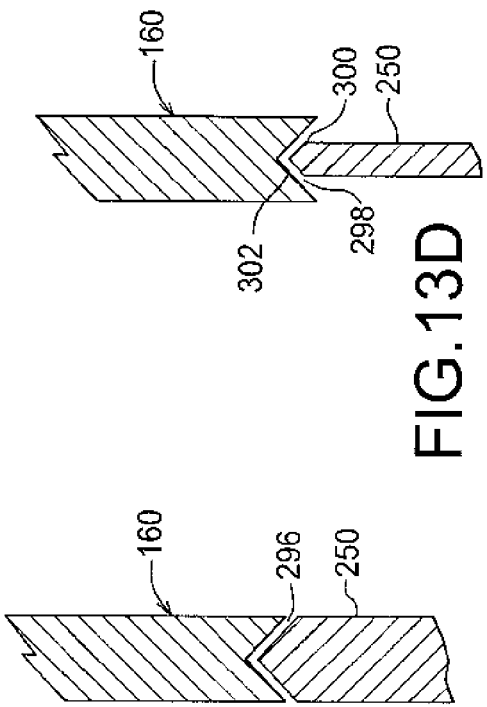
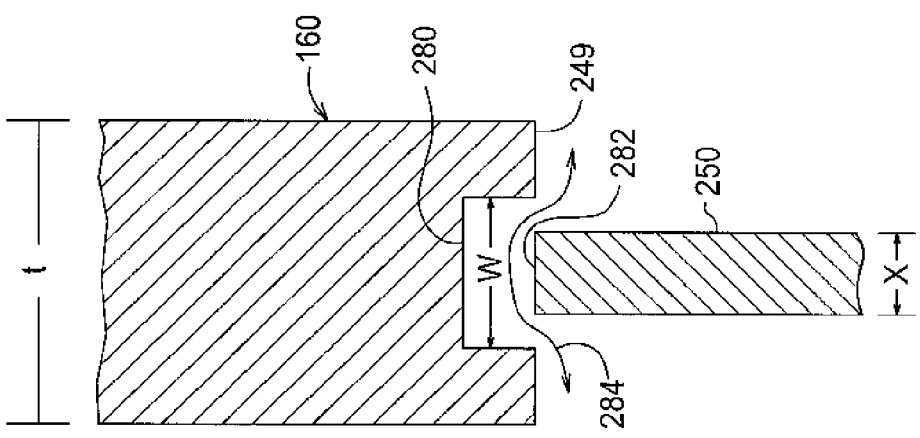
FIG. 13A
FIG. 13B
FIG. 13C
FIG. 13D
FIG. 12

MULTI-WORKPIECE PROCESSING CHAMBER

This application is a continuation application of U.S. patent application Ser. No. 10/828,614 filed Apr. 21, 2004 now U.S. Pat. No. 7,276,122, the disclosure of which is incorporated herein by reference.

BACKGROUND OF THE INVENTION

The present invention is related generally to the field of workpiece processing such as, for example, processing semiconductor wafers and, more particularly, to a multi-workpiece processing chamber and its method of use.

A number of processing systems, currently used in the production of semiconductor wafers, are capable of processing more than one wafer at a time for purposes of enhancing system throughput. It has been asserted in the prior art, however, that a single-wafer process chamber provides more uniform process results when compared to multi-wafer processing chamber configurations. Presumably, this degradation in "across-wafer" and "station-to-station" uniformity is thought to be directly attributable to communication between adjacent wafer processing stations within a shared process chamber and environment.

Process uniformity, however, is of increasing concern, particularly in view of an industry emphasis on ever-decreasing device feature sizes. One example, attempting to provide a compromise between the asserted contamination problem that is associated with batch processing in a shared process environment and limited throughput in the use of single-wafer process chamber, is seen in U.S. Pat. No. 5,855,681 (hereinafter the '681 patent). The latter adopts the use of "tandem" single wafer processing chambers, having processing regions that are described as being separate from one another (see col. 4, ln. 37-40). A single chamber body is used to define these separate processing regions. The processing region defined by each tandem chamber is deemed by the patent as isolatable from the processing region of the other tandem chamber by virtue of limiting communication between the adjacent processing regions only to that which selectively occurs through an exhaust system. Such selective communication would presumably be controlled based on the pumping status of the vacuum pumping system. Otherwise, the tandem chambers appear to function, from a process standpoint, in a way which is essentially the same as a pair of separate single-wafer processing chambers (see, for example, col. 2, ln. 54-56). In this regard, the system provides for multiple, isolated processes to be performed concurrently in at least two regions (see col. 4, ln. 44-51), which reasonably suggests that a first process can be performed in one processing region of a tandem chamber while a second, different process is performed in the other processing region of that same tandem chamber.

While there may be advantages associated with the asserted capabilities of the separate, tandem chambers of the '861 patent in providing for simultaneously executing different processes in each chamber, it is a concern that there are many circumstances in which such capability is not necessary. That is, there are many instances in which it is advantageous, at least from a throughput standpoint, to perform the same process at both processing stations, without a need for providing the additional capability to practice different processes. It is a further concern that certain aspects of the configuration for the tandem chamber of the '861 patent such as, for example, its exhaust configuration, are quite complex. This exhaust system is seen in FIG. 21 of the patent wherein a pair of individual exhaust conduits 621 merge into a common exhaust channel 619. It is considered that the use of this complex exhaust system adds considerable expense to the fabrication of the tandem chamber arrangement. Still further problems could be introduced if there is any tendency for contaminants to build up in exhaust channels 621, leading to different pressures in one chamber with respect to the other. Likewise, other features, which result in the capability to practice different processes, are considered to add expense to the cost of the system in order to achieve a level of region-to-region process isolation which may never be needed, in view of a particular end user's needs.

Referring to FIG. 1, one prior art process chamber configuration, that has been found to be useful and which avoids the aforedescribed concerns with respect to the '681 patent, is generally indicated by the reference number 10. Chamber 10 includes a first wafer pedestal 12 and a second wafer pedestal 14, each of which is configured for supporting a wafer (not shown) thereon.

Referring to FIG. 2 in conjunction with FIG. 1, chamber 10 includes a chamber base 20 that is best seen in the cross-sectional view of FIG. 2 and is integrally formed with an arrangement of sidewalls 22. Chamber base 20 defines a single exhaust port 24 which serves the entire chamber interior. A single chamber lid (not shown) is hinged to chamber 10 along one of its peripheral edges and seals against an O-ring 28 (FIG. 1) that is supported by sidewall arrangement 22. A partition 30 is integrally formed with sidewalls 22 and with chamber base 20 so as to extend between a lengthwise pair of the sidewalls, across the entrance leading into exhaust port 24. A notch 32 is defined in partition 30 so as to provide for flow communication between opposing sides of the partition. A pump spool 34 is attached to chamber base 20 and defines an exhaust channel 36 that is aligned with exhaust port 24.

Referring to FIG. 2, partition 30 does not seal against chamber lid 26. In this regard, a gap (not shown) is formed between an upper edge of the partition and the chamber lid so that the upper edge confronts the chamber lid, but does not contact it. Such potential rubbing contact is undesirable at least for the reason that particle generation would occur in a way that can adversely affect a process that is being executed at either of the wafer pedestals in the chamber. Partition 30 has a thickness that is on the order of ¼ or less of the thickness of the chamber sidewalls. Accordingly, the partition is not intended to support a pressure differential from one side to the other, since continuous pressure equalization occurs very rapidly through notch 32. It should be appreciated that even slight pressure differences from one processing station to the other can produce significant differences in on-wafer process results.

Referring again to FIG. 1, chamber 10 is considered to comprise a batch processing system, since no capability is provided for performing a different process at wafer pedestal 12 than the process which is preformed at wafer pedestal 14. That is, either the same process should be performed at both pedestals or one of the pedestals should be inactive. This system will not accommodate performing different processes at the pedestals, since some degree of cross-contamination can occur. At the same time, however, it is recognized that this limited level of cross-contamination may be insignificant when the same process is performed at multiple stations that are within a common process chamber and environment.

Of course, some process constraints can be controlled individually for each wafer pedestal, as has long been practiced. For example, variations in gas mixtures intended to further enhance process uniformity can be provided using separate showerheads (not shown), one of which is provided for each wafer pedestal.

The chamber of FIGS. 1 and 2 has provided more than acceptable process results while avoiding the need to use completely isolated single wafer process environments, as is taught by the '228 patent. In this regard, the present invention provides more than acceptable process results in a multi-wafer chamber maintaining a limited communication between adjacent processing regions, which continues to overcome the aforementioned concerns associated with the '228 patent, while providing still further advantages over all prior art of which Applicant is aware, as will be described in detail hereinafter.

SUMMARY OF THE INVENTION

In a system for processing a workpiece, an apparatus and method are described. In one aspect of the present invention, a multi-workpiece chamber is provided including at least two processing stations, each of which is configured for exposing one of the workpieces to the treatment process. A partition is configured to cooperate with the chamber such that the partition is disengagably removable from the chamber and, thereafter, re-engagable with the chamber for selectively dividing the processing stations from one another.

In another aspect of the present invention, a multi-workpiece chamber is provided including at least two processing stations, each of which is configured for exposing one of the workpieces to a treatment process. A partition arrangement is positioned between the processing stations, supported by the multi-workpiece chamber, and configured to cooperate with the chamber to provide only for non-line-of-sight travel of certain ones of the process related products between the processing stations, whereby the certain ones of the process related products, that are only able to travel line-of-sight are, therefore, unable to move between the processing stations when the partition is engaged with the chamber.

In still another aspect of the present invention, a multi-workpiece chamber includes at least two processing stations, each of which is configured for exposing one of the workpieces to a treatment process, and which defines an exhaust port that is positioned at least generally between and equidistant from each of the processing stations for use in evacuating the chamber in association with the treatment process. An exhaust arrangement is in flow communication with the exhaust port for conducting an exhaust flow from the multi-workpiece chamber. The exhaust arrangement includes a flow divider arrangement which divides the exhaust flow into at least two approximately equal exhaust flow portions that leave the multi-workpiece chamber in a way which enhances uniformity of the treatment process for the first and second workpiece stations. In one feature, the exhaust flow portions are at least approximately equal to one another.

In yet another aspect of the present invention, a multi-workpiece chamber includes at least two processing stations, each of which is configured for exposing one of the workpieces to a treatment process and which defines an exhaust port that is at least generally between and equidistant from each of the processing stations and including an exhaust arrangement that is connected to the exhaust port to define an exhaust channel to support an exhaust flow for use in evacuating the chamber. A partition configuration is configured to cooperate with the chamber such that the partition configuration is disengagably removable form the chamber and, thereafter, re-engagable with the chamber. The partition configuration including a partition portion that is positioned between the processing stations, when engaged with the chamber, and including a baffle portion supported by the partition portion and extending outward from the exhaust port and into the exhaust channel in a way which divides the exhaust flow into at least two exhaust flow portions that leave the multi-workpiece chamber.

In a continuing aspect of the present invention, a multi-workpiece chamber includes at least two processing stations, each of which is configured for exposing one of the workpieces to the treatment process. A first partition arrangement is selectively removable from the multi-workpiece chamber and is positionable between the processing stations, supported by the multi-workpiece chamber, for establishing an exchange characteristic of the process related products between the processing stations when so positioned. At least one modified partition arrangement is provided for use in replacing the first partition arrangement to establish a modified exchange characteristic of the process related products between the processing stations. In one feature, the exchange characteristic relates to mobility of the process related products.

BRIEF DESCRIPTIONS OF THE DRAWINGS

The present invention may be understood by reference to the following detailed description taken in conjunction with the drawings briefly described below.

Figure 5:
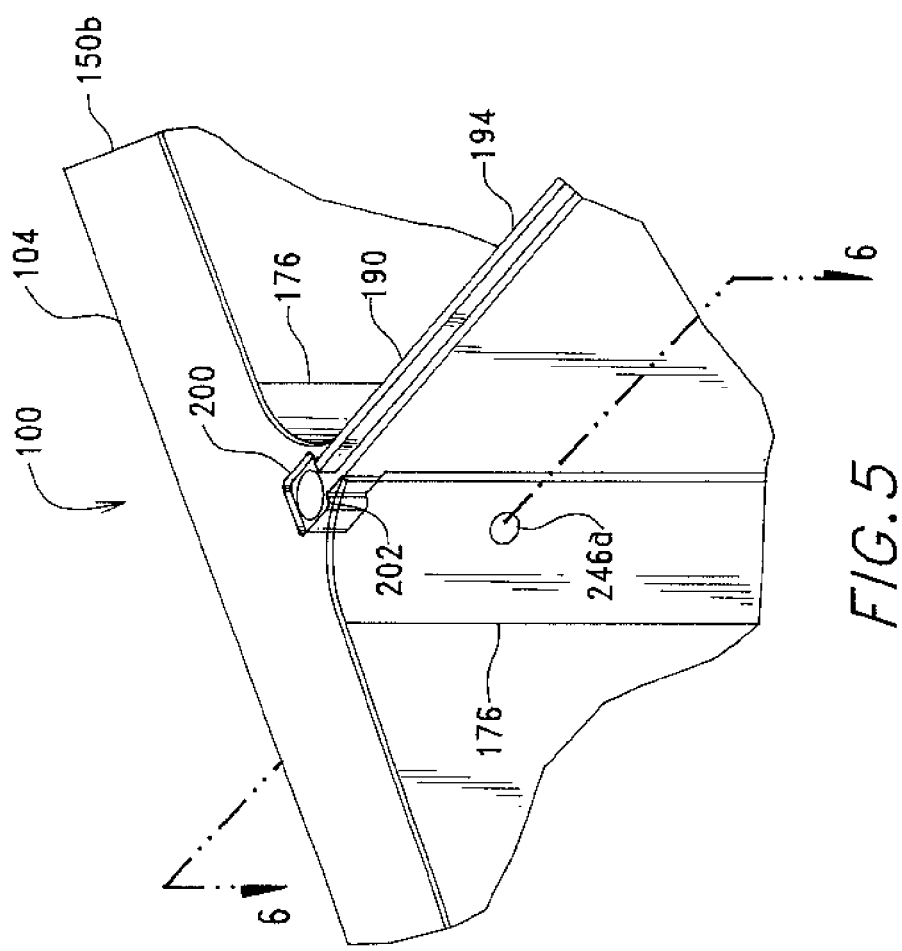
FIG. 5 is a diagrammatic enlarged cutaway perspective view of a partition arrangement and processing chamber, used in the system of the present invention, shown here to illustrate one configuration for disengageably installing the partition arrangement in the processing chamber.
Figure 6:
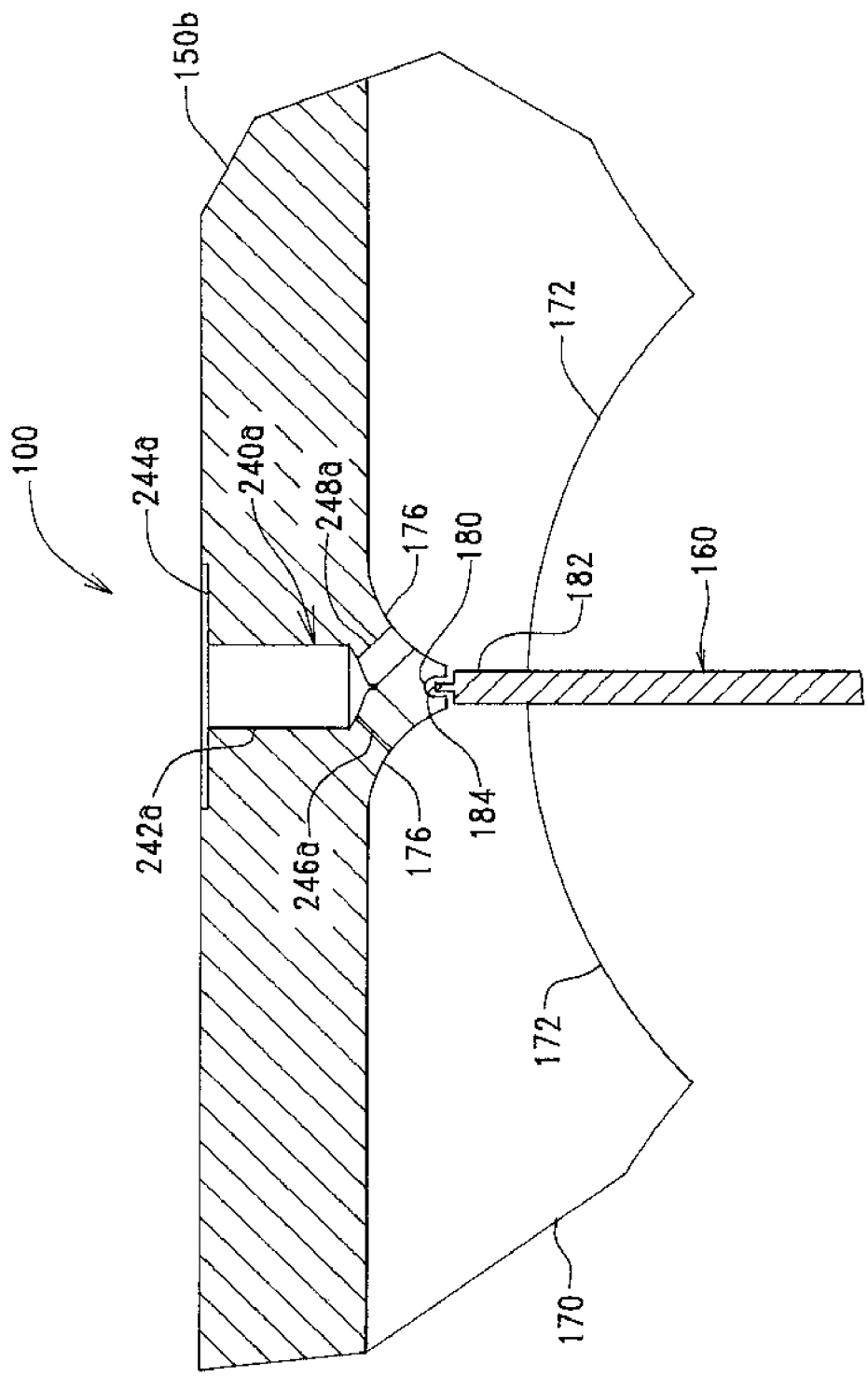

FIG. 6 is a diagrammatic enlarged cutaway view, in cross-section, taken along a line 6-6, as shown in FIG. 5, shown here to illustrate details with respect to cooperation between the partition arrangement and chamber sidewall with which it interfaces so as to define a circuitous gap between the partition arrangement and chamber sidewall, as well as details with respect to a passage arrangement that is defined by the chamber sidewall.

Figure 7:
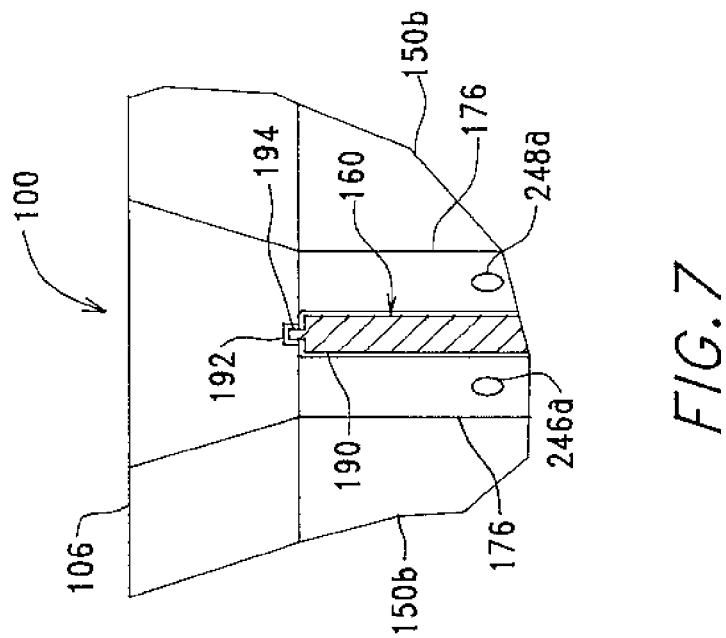

FIG. 7 is a diagrammatic enlarged cutaway view, in cross-section, taken at a point along an upper lengthwise margin of the partition arrangement and looking toward a rear sidewall of the processing chamber, shown here to illustrate details with respect to a cooperating configuration of the chamber lid and partition arrangement which defines a circuitous gap therebetween.

Figure 8:
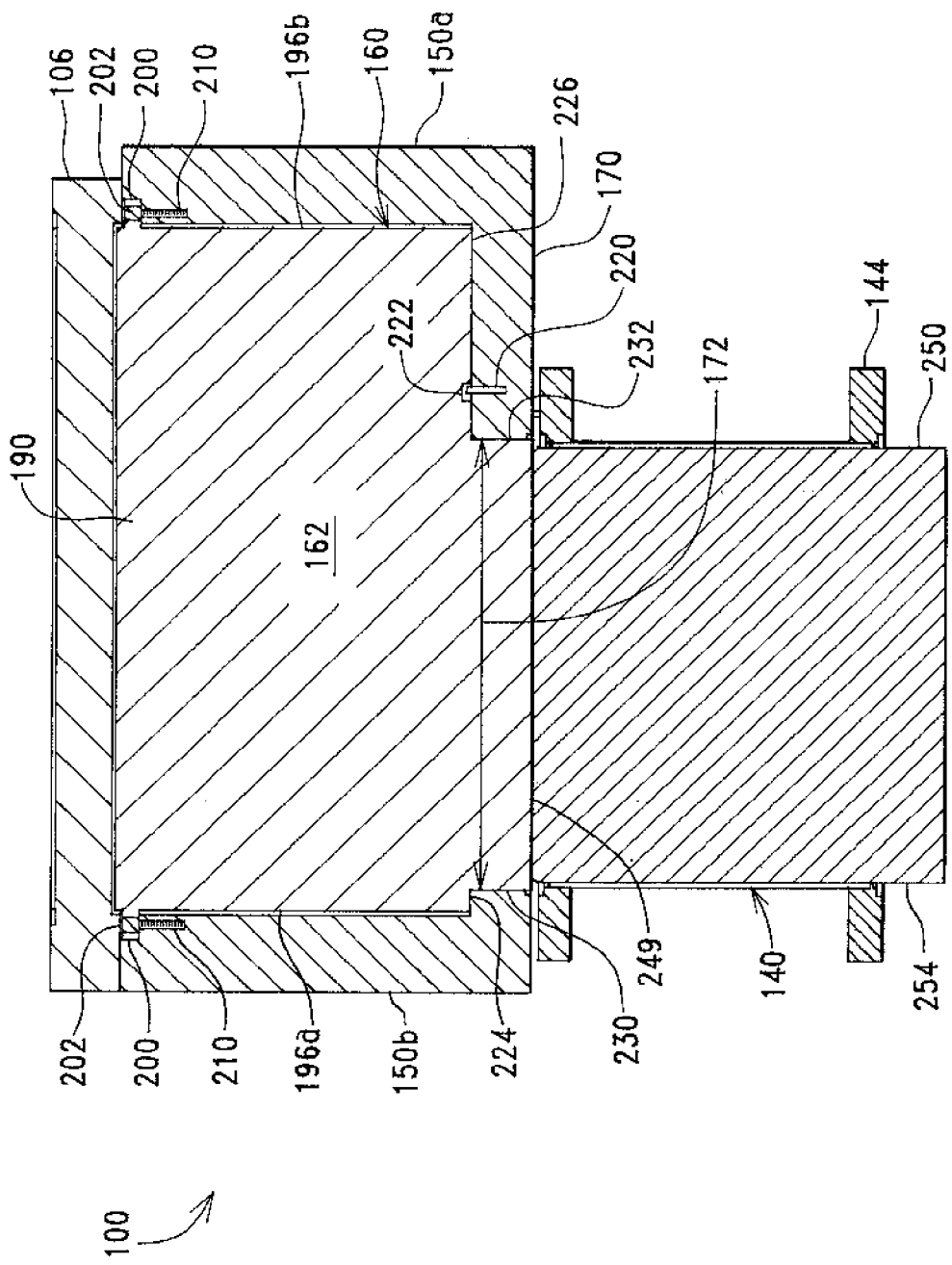

FIG. 8 is a diagrammatic cross-sectional view, in elevation, shown here to illustrate further details with respect to installation of the partition arrangement within the processing chamber and to illustrate the arrangement of a baffle within a pump spool forming part of the exhaust system from the processing chamber.

Figure 9:
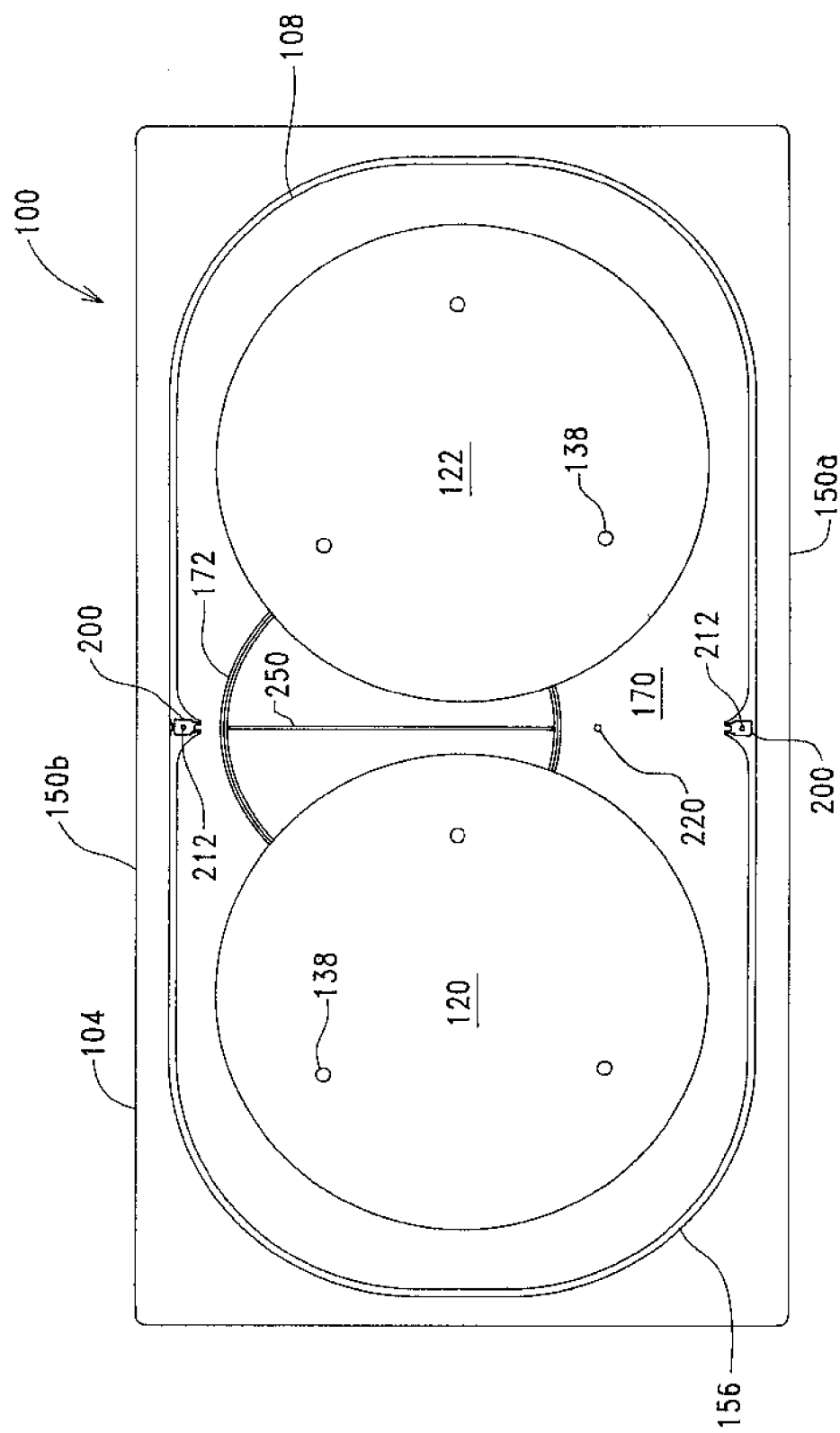

FIG. 9 is a diagrammatic plan view of the processing chamber having the processing chamber lid removed, shown here to illustrate further details with respect to installation of the partition arrangement, baffle and other features.

Figure 1:
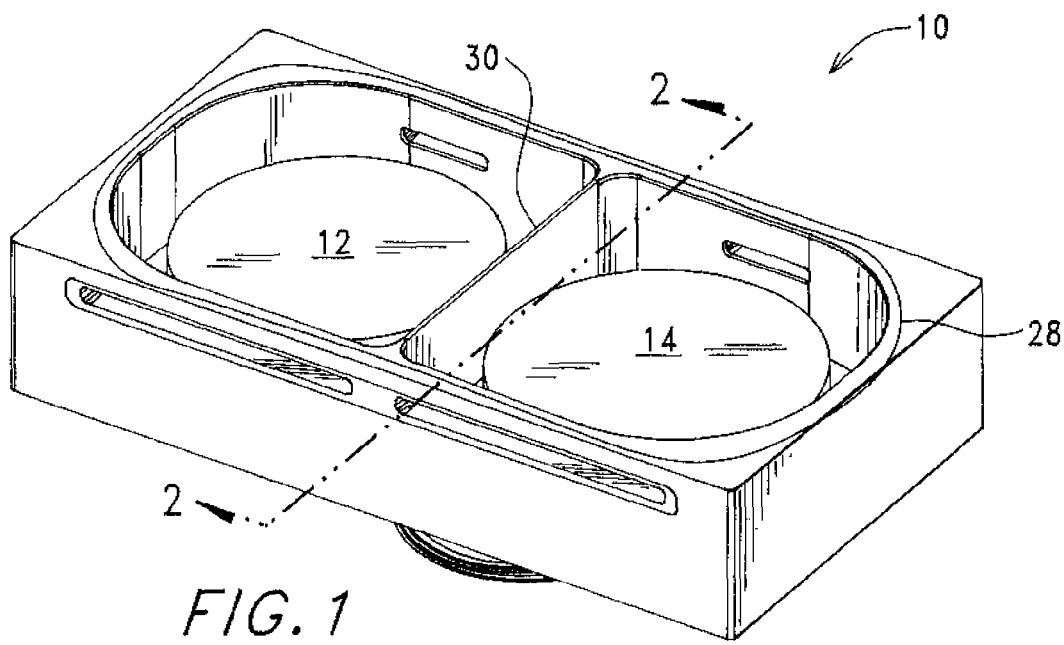
FIG. 1 is a diagrammatic perspective view of a prior-art processing chamber, shown here to illustrate details with respect to its structure.
Figure 2:
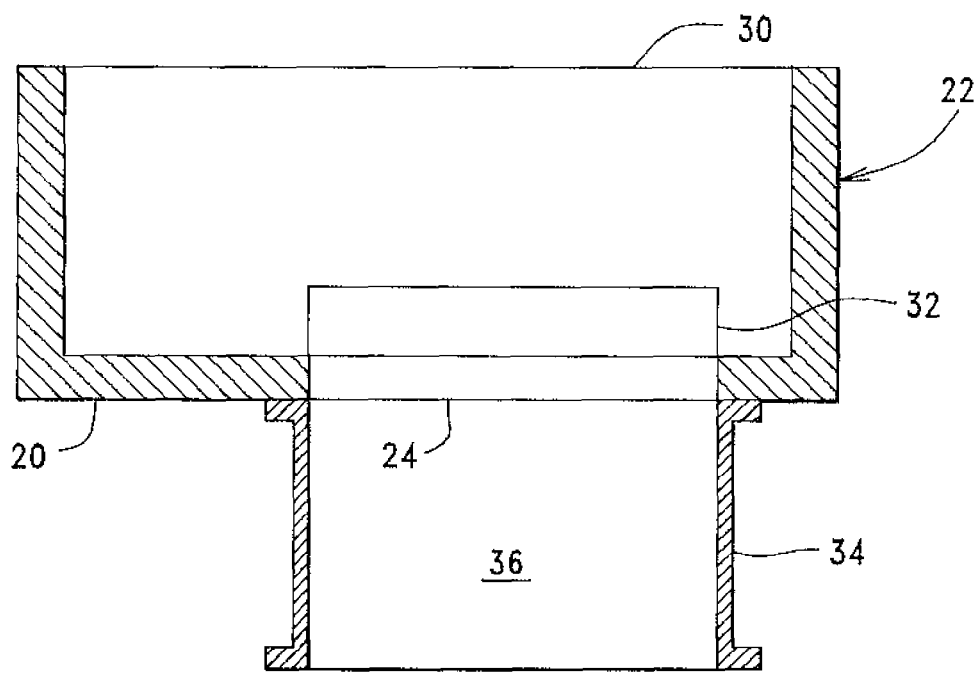
FIG. 2 is a diagrammatic view, in elevation, shown here to illustrate details with respect to a partition that is used in the processing chamber of FIG. 1.
Figure 3:
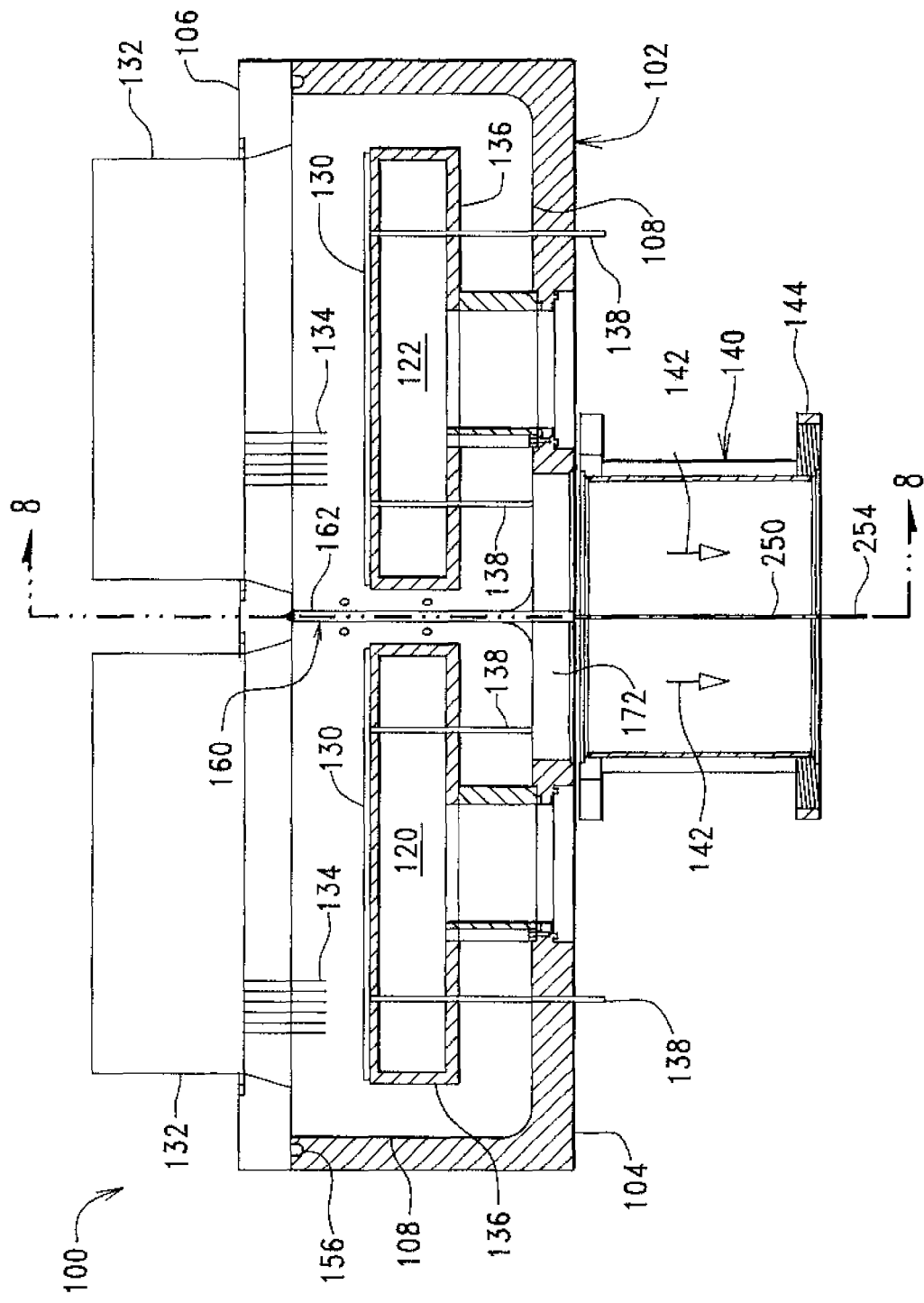
FIG. 3 is a diagrammatic view, in elevation, of a workpiece processing system that is produced in accordance with the present invention, shown here to illustrate its construction.
Figure 10:
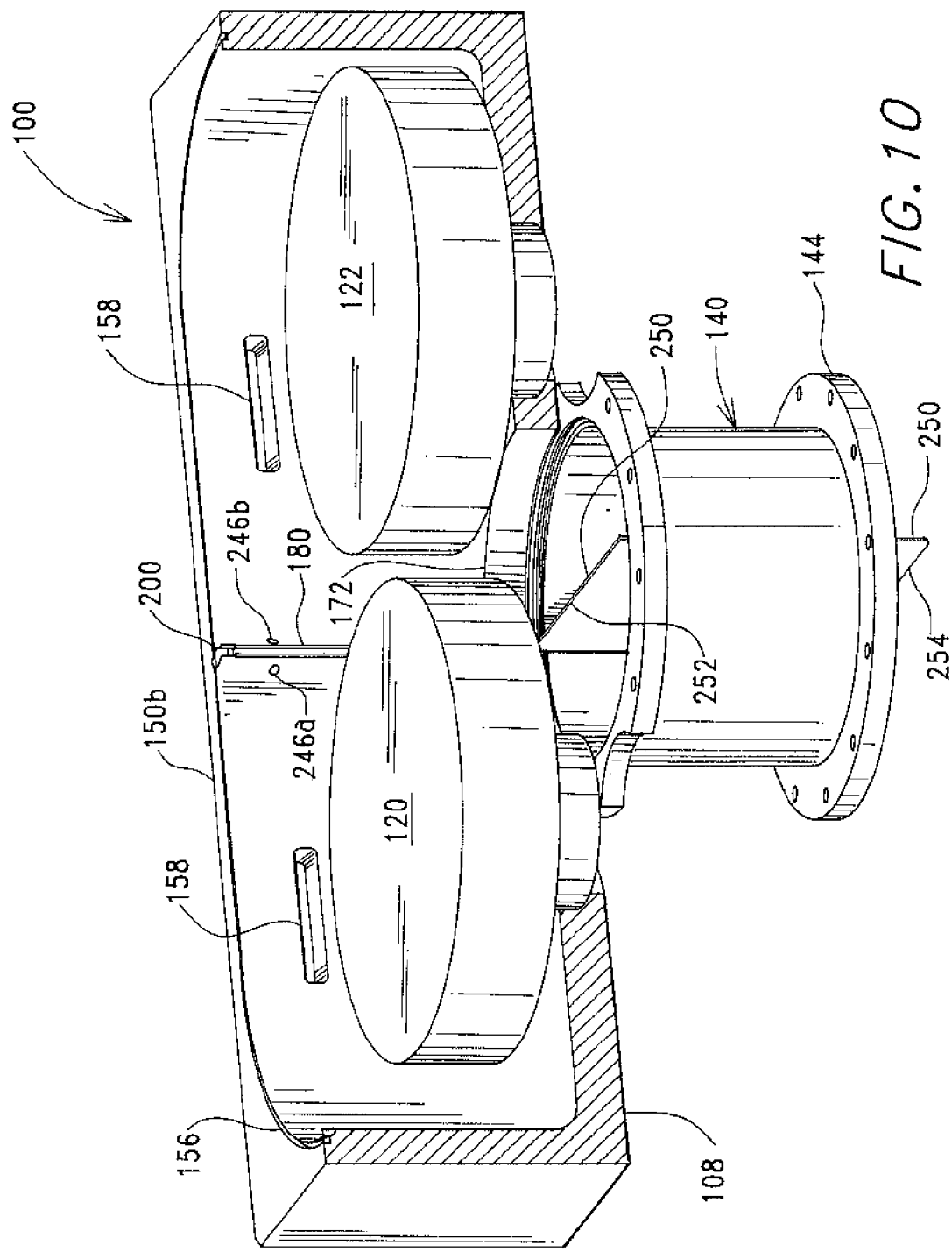

FIG. 10 is a diagrammatic partially cutaway perspective view of the processing system of FIG. 3, also having the chamber lid removed, shown here to illustrate still further details with respect to the partition arrangement installation features and the baffle.

Figure 11:
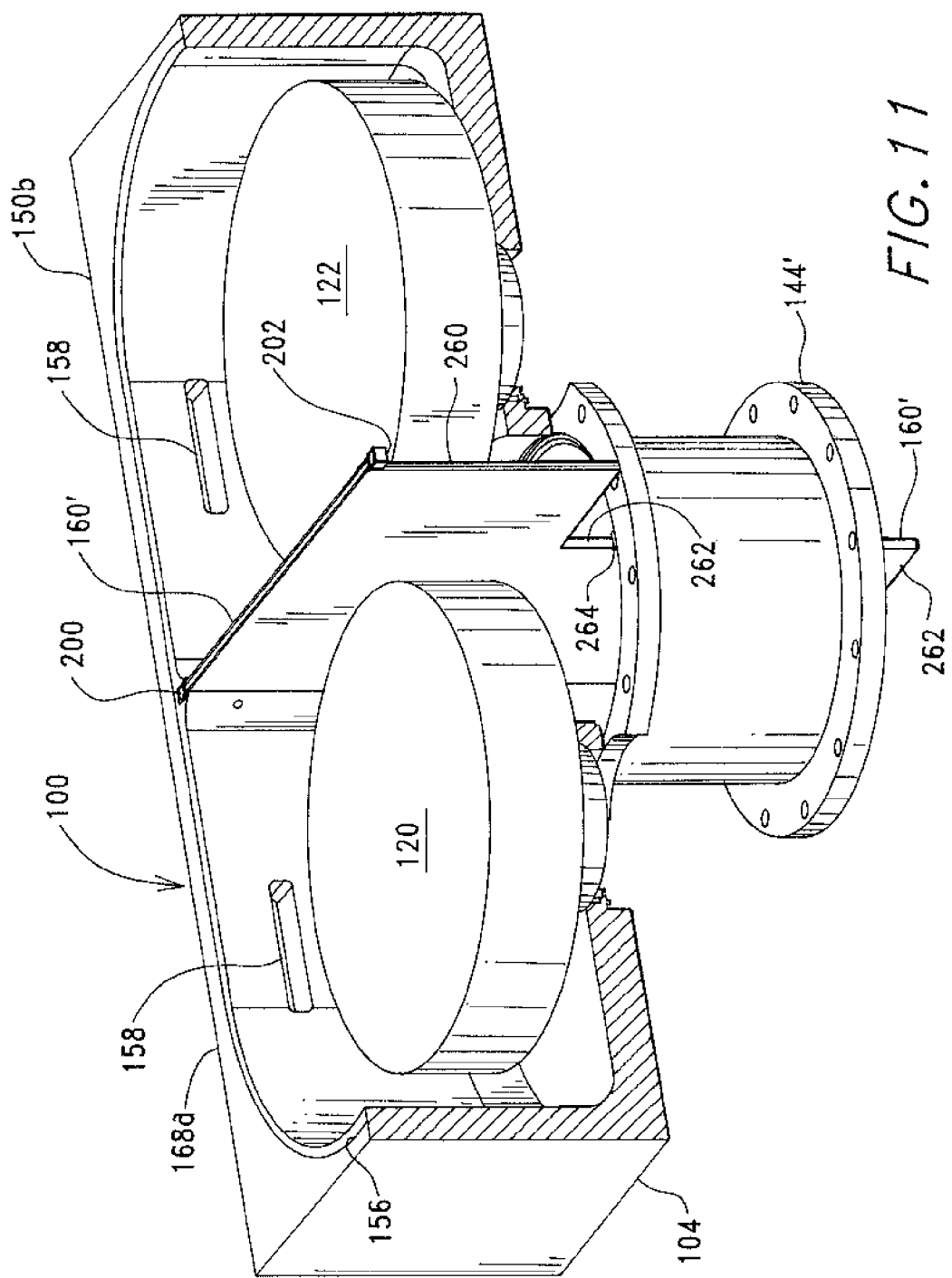

FIG. 11 is a diagrammatic partially cutaway perspective view of the processing system of the present invention, shown here having a modified partition arrangement installed therein which includes a partition portion and a baffle portion.

FIG. 12 is an enlarged cross-sectional cutaway view, taken through the thickness of the partition arrangement at its lowermost edge and the baffle at its confronting, uppermost edge, showing an alternative configuration of its bottom edge and its relationship to a spool piece supported baffle.

FIGS. 13a-d are enlarged cross-sectional cutaway views, similar to the view of FIG. 12, taken through the thickness of the partition arrangement at its lowermost edge and the baffle at its confronting, uppermost edge, showing an number of alternative gap configurations.

DETAILED DESCRIPTION OF THE INVENTION

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein. It is noted that the drawings are not to scale and are diagrammatic in nature. Further, like reference numbers are applied to like components, whenever practical, throughout the present disclosure. Descriptive terminology such as, for example, up/down, right/left, front/rear and the like has been adopted for purposes of enhancing the reader's understanding, with respect to the various views provided in the figures, and is in no way intended as been limiting.

FIG. 3 is a diagrammatic view, in elevation, of a semiconductor processing system, generally indicated by the reference number 100, according to one embodiment of the present invention. While system 100 represents one implementation that is useful in the practice of the present invention, it is to be understood that the present invention may be utilized in conjunction with a variety of alternative configurations and the presently illustrated implementation is not intended as being limiting. A processing chamber arrangement 102 forms part of system 100 and is illustrated having a front portion cut away in order to reveal the chamber interior configuration. Of course, there must be a provision for transferring workpieces into and out of processing chamber arrangement 102, as will be further described below.

Still referring to FIG. 3, chamber arrangement 102 is made up of a chamber 104, which may be referred to as a chamber bowl, and a chamber lid 106. The latter may be hingedly attached to the chamber bowl. The chamber lid and chamber bowl cooperate to define a chamber interior or cavity 108 that is isolatable from ambient pressure. A first processing station 120 and a second processing station 122 are positioned in chamber interior 108. For purposes of the present example, system 100 will be described in the context of removing a photoresist layer or pattern (not shown) from semiconductor, opto-electronic or flat panel display workpieces 130, although one of ordinary skill in the art will appreciate that this system is readily useful in the application of other processes including, but not limited to various implementations of chemical vapor deposition, atomic layer deposition and plasma etch. Accordingly, for purposes of the present example, a pair of plasma sources, each individual one of which is indicated by the reference number 132, is provided. For purposes of photoresist removal, inductively coupled plasma (ICP) sources, may be used such that one source is associated with each of the processing stations so as to generate a plasma 134 which is represented by a number of dashed lines. Other suitable plasma sources include, but are not limited to microwave sources, surface wave plasma sources, ECR plasma sources, and capacitively coupled (parallel plate) plasma sources.

Continuing with a description of FIG. 3, each workpiece 130 such as, for example, a semiconductor wafer is supported on a susceptor 136. Each susceptor may be useful in heating the workpiece to a desired temperature. Any suitable type of susceptor may be used such as, for example, a suitable platen. Lift pins 138 are used to raise and lower each workpiece with respect to each of susceptors 136. The lift pins are shown in a retracted position such that each workpiece is supported on one of the susceptors. While only two lift pins are illustrated, in the present figure, per susceptor for purposes of illustrative simplicity, a minimum of three lift pins is required per susceptor. Another part of system comprises an exhaust arrangement 140 that is used in producing a vacuum in chamber interior 18. For this purpose, exhaust gas 142 flows in a direction indicated by arrows. Exhaust arrangement 140 includes, for example, a flanged pump spool 144, which serves in the manner of a tailpiece, and which is attached to chamber bowl 104 in any suitable manner such as, for example, using a plurality of bolts (not shown). Sealing may be performed, for example, using an O-ring (not shown) between the flanged spool and chamber bowl.

Figure 4:
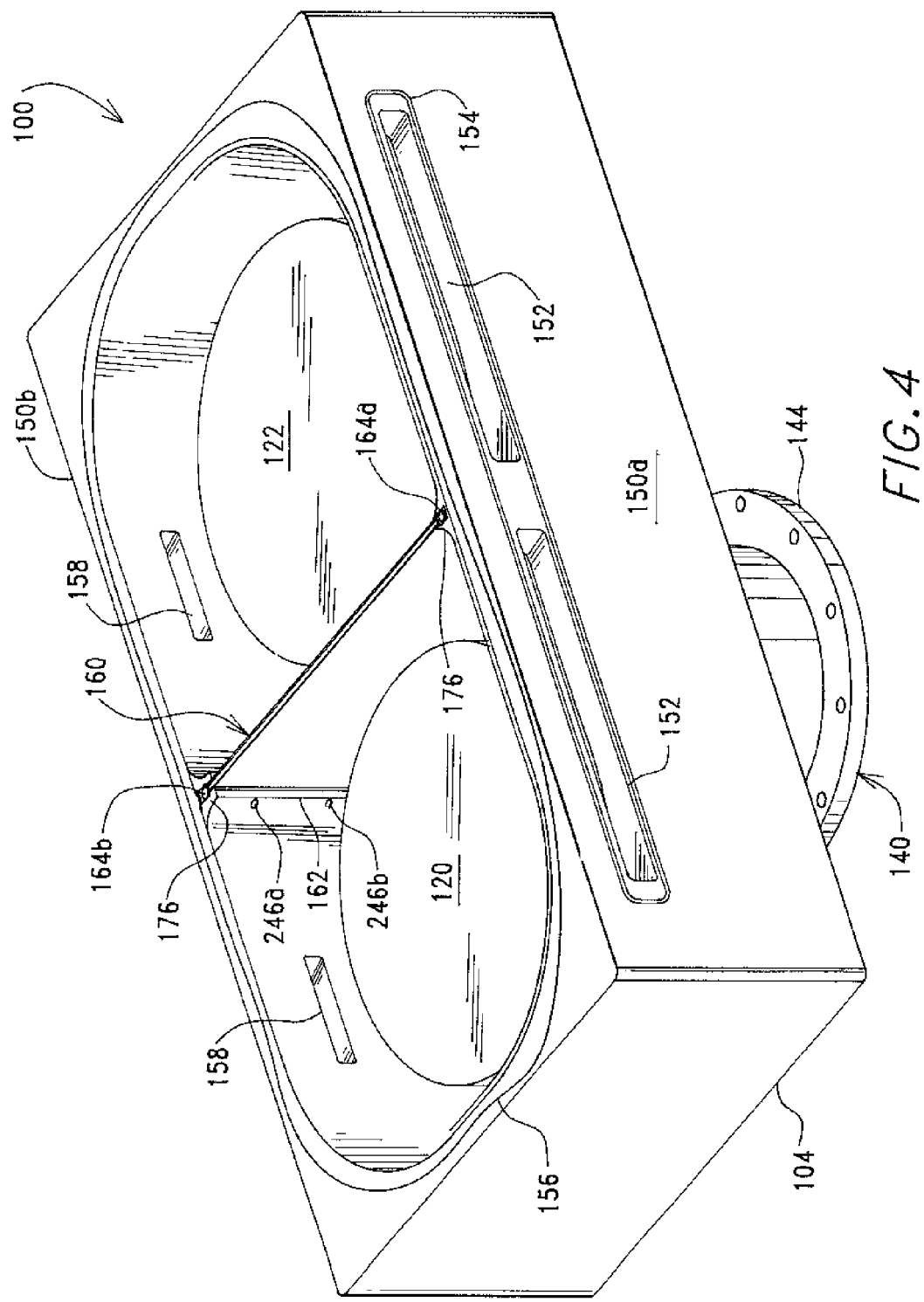
FIG. 4 is a diagrammatic perspective view of a processing chamber arrangement that is used in the system of FIG. 3, shown here to illustrate further details with respect to the structure of the chamber arrangement.

Referring now to FIG. 4, further details of system 100 will now be described with regard to this perspective view. For purposes of clarity, chamber lid 106 (FIG. 3) and associated sources 132, which are supported by the chamber lid have not been shown. A front lengthwise sidewall 150a of chamber bowl 104 defines a pair of slit openings 152 through which wafers can be inserted and removed from the chamber for each one of the wafer susceptors. An O-ring 154 surrounds both of these slit openings for use in sealing against other components (not shown) such as, for example, a wafer transfer chamber, a description of which is beyond the scope of present application. An O-ring groove, indicated by the reference number 156 (also seen in FIG. 3), is defined in upper ends of the chamber peripheral sidewalls for receiving an O-ring (not shown) that is used in sealing chamber lid 106 (FIG. 3) against the chamber bowl. Another pair of slits, each of which is indicated by the reference number 158, is used for process monitoring, in a rear lengthwise chamber sidewall 150b.

Referring to FIGS. 3 and 4, chamber bowl 104 is configured to support a partition arrangement 160. The partition arrangement includes a generally planar partition plate 162 having peripheral edge configurations that will be described in detail below. Partition plate 162 extends generally between processing stations 120 and 122 in a way which may serve to bisect processing chamber 104 and is held in position, proximate to its upper corners, using fasteners 164a and 164b, as will be described.

Turning now to FIGS. 5 and 6 in conjunction with FIGS. 3 and 4, further details will now be provided with regard to the way in which partition arrangement 160 is supported by the chamber bowl. It is noted that FIG. 5 is an enlarged, partially cut away detail view, in perspective, illustrating the rear, upper corner of partition arrangement 160 as it cooperates with rear, lengthwise chamber sidewall 150b. FIG. 6 is an enlarged cross-sectional, partially cut away, detailed view taken generally along a line 6-6, which is illustrated in FIG. 5. It is noted that FIG. 6 further illustrates a portion of a chamber base 170, immediately adjacent to an exhaust port 172 (only partially shown) that is defined in the chamber base. Like the front lengthwise chamber sidewall, rear lengthwise chamber sidewall 150b includes an inwardly projecting rib 176 that is essentially identical in configuration.

Referring to FIG. 6, each rib 176 defines an elongated slot 180 having a suitable configuration such as, for example, a semicircular cross-sectional shape, although any suitable configuration can be used in view of this description. An edge margin 182 of partition arrangement 160 includes a projecting, elongated tab 184 that is inset with respect to each of the outermost major surfaces of the partition arrangement. Tab 184 projects into slot 180 without contacting the interior surface of elongated slot 180. Accordingly, rib 176 of the chamber cooperates with the vertical edge margins of the partition arrangement such that a circuitous, serpentine or non-line-of-sight path is defined between the opposing side margins of the partition arrangement and the respective chamber sidewalls which they confront. Suitable dimensions for a circuitous gap that is useful in the context of the present application include approximately 0.5 to 5 mm. Of course, a larger gap produces a greater conductance such that gap size can be tailored to the needs of a particular process. In this regard, it should be appreciated that a greater value of conductance is generally useful to further enhance pressure equalization at lower processing pressures. The significance of this highly advantageous configuration will be described an appropriate point below.

Referring to FIG. 7, the configuration of partition arrangement 160 with respect to chamber lid 106 will now be described. FIG. 7 is an enlarged, partially cut away view taken at some representative point along the length of an upper edge margin 190 of the partition arrangement looking towards rear sidewall 150b. Chamber lid 106 defines an elongated groove 192 having a length that is sized according to a length of an upper margin 190 of the partition arrangement. Upper margin 190 includes a projecting elongated tab 194 having an overall length which projects into groove 192 with chamber lid 106 in a closed position. As is the case with the partition and each of sidewall ribs 176, described above, a circuitous path is formed through the cooperation of chamber lid 106 with tab 194. Thus, such a circuitous path is formed at both side margins, as well as the upper margin of the partition arrangement.

Referring to FIGS. 5, 8 and 9, details will now be provided with regard to the way which the removable partition is selectively engageable and disengageable with chamber 104. FIG. 8 is a diagrammatic cross-sectional view, taken along a line 8-8, as shown in FIG. 3, in a way which shows details with regard to selective attachment of the partition arrangement to the chamber. Opposing vertical edges of partition arrangement 160 are indicated by the reference numbers 196a and 196b, in FIG. 8. Exhaust port 172 is illustrated by a double-headed arrow that extends between the surfaces which define its lateral extents. It is noted that the O-ring disposed between the chamber lid and chamber bowl is not shown for purposes of better illustrating those features that are of immediate interest. FIG. 9 is a diagrammatic plan view of chamber 104 with the chamber lid removed, the partition arrangement removed and without wafers on wafer susceptors 120 and 122 so as to reveal all wafer pins 138, only two of which are identified by reference numbers. Exhaust port 172 is also partially and one visible, as defined by chamber base 170. Each lengthwise chamber sidewall 150a and 150b defines a pocket 200 for receiving a mounting tab 202 which extends laterally outwardly from partition plate 162 to be received in one of pockets 200. As is best seen in FIG. 5, pocket 200 and mounting tab 202 cooperate to limit movement of partition arrangement 100 in a direction that is parallel to upper margin 190 of the partition arrangement and to limit movement of upper margin 190 in a direction that is generally normal to the plane of the partition arrangement. In this regard, it is noted that mounting tab 202 includes a width which is wider than the thickness of partition plate 162 so that each mounting tab is captured within each pocket 200. It should also be appreciated that this arrangement further serves to establish the height of the partition arrangement within chamber 104. A pair of fasteners (FIG. 8), each of which is indicated by the reference number 210, extends through respective holes that are defined by each one of mounting tabs to be received in each one of a pair of apertures, each of which is indicated by the reference number 212 (FIG. 9), which are formed in lengthwise chamber sidewalls 150a and 150b. Any suitable fastener may be used. In the present example, threaded stainless steel fasteners are used, having a head that is formed of, or covered with, same material as the chamber body. Mounting tabs 202 can be formed in any suitable way such as, for example, by using a separate sheet of material and, thereafter, attaching the mounting tab to the overall partition arrangement in a suitable way such as, for example, by welding.

Referring to FIG. 8, chamber base 170 supports a pin 220 which is centered with respect to a desired lengthwise or lateral position of the lowermost extents of partition 160. This pin can may be formed from any suitable material such as, for example, stainless steel or an aluminum alloy and may be installed into the chamber base by any suitable technique such as, for example, by a pressed fit. An alignment cavity 222 is formed inwardly from the associated lower edge of partition plate 162 having a cavity width which is less than the thickness of the partition plate. As the partition arrangement is installed in chamber 104, alignment cavity 222 is aligned to receive an upper end of pin 220 in a way which prevents lateral movement of the lowermost extents of partition arrangement 100. Accordingly, the partition arrangement is supported at three points in a way which precisely establishes its position in every direction relative to the chamber. With regard to this position in a vertical sense, two lower edges of the partition arrangement, indicated by the reference numbers 224 and 226, respectively, are in a confronting relationship with an interior surface of chamber base 170 when the partition arrangement is installed, as shown. These edges should be slightly out of contact with the chamber base. In the present example, a clearance of approximately 0.02 inch has been found to be acceptable. Rubbing contact between these lower edges and the chamber base is generally undesirable, depending on process constraints, since particle generation is likely to result. Lower edges 224 and 226 should, nonetheless, be arranged as closely as is reasonably practical to the chamber base, for reasons yet to be described. Partition plate 162, at a lowermost end, also includes a pair of vertically disposed edges 230 and 232 having a width therebetween which is sized to be received in exhaust port 172 such that these edges are in a spaced apart relationship from the inner peripheral sidewall of exhaust port 172. Edges 230 and 232 should, likewise, be arranged so as to be as close as practical while remaining out of contact with the inner peripheral sidewall of the exhaust port.

Attention is now directed to FIGS. 4-7 for purposes of describing a feature which is formed as part of rear sidewall 150b of chamber 104. Specifically, two essentially identical passage arrangements are formed in chamber sidewall 150b in a vertically spaced apart relationship with respect to one another. Accordingly, an upper one of these passage arrangements is indicated by the reference number 240a in FIG. 6. Passage arrangement 240a includes a main passage 242a that is formed, for example, by drilling from the outward facing major surface of sidewall 150b. If so desired, a landing 244a can be formed surrounding main passage 242a. First and second branch passages, 246a and 248a are formed so as to extend from each one of an opposing pair of inner surfaces of rib 176 inward to communicate with main passage 242a. It is noted that an entrance opening of a branch passage 246b is seen in FIG. 4 which forms part of the lower one of the passage arrangements. These passage configurations can be used for a number of different purposes and can serve in several capacities. For example, a manometer may be arranged to sense the pressure from main passage 242a. As another example, one of these passage arrangements could be used for gas injection. In the present example, one of the passage arrangements is used for pressure sensing while the other is used for gas injection. Aside from the specific purpose for which each of these passage arrangements is used, it should be appreciated that each one of these passage arrangements defines a circuitous path from one side of partition 160 to the other side of partition 160, thereby contributing to pressure equalization between processing stations 120 and 122, while further acting in a highly advantageous manner that is yet to be brought to light at an appropriate point below.

Referring generally to the aforedescribed figures and having described the structure of chamber arrangement 102 in detail above, it is now appropriate to discuss a number of the advantages which it provides. In this regard, it is noted that the same process must be practiced at each processing station or one station may be idle. Of course, adjustments in gas mixtures, such as described above, can be made to further enhance process uniformity. It is recognized that a number of process related products are associated with plasma 134. These process related products generally include non-reactive species such as, for example, Ar, $CO_2$, $O_2$, $H_2$ and reactive species such as, for example, charged ions, $Ar^+$, $H^+$, $O^-$, $O^+$, $F^-$. It is further recognized that these two different types of species travel in different ways within chamber interior 108. Specifically, non-reactive species are capable of traveling along a line-of-sight path and a non-line-of-sight, circuitous path while reactive species which react with chamber surfaces are generally capable of only line-of-sight travel. Moreover, it is considered that movement of non-reactive species from one processing station to the other processing station has little, if any, impact upon process results. On the other hand, it is considered that movement of reactive species from one processing station to the other processing station could have a detrimental influence upon process results. For example, if a charged particle, serving as a reactive species, is intended to impact a wafer at processing station 120, but instead travels all the way so as to somehow impact a wafer at processing station 122, such a charged particle may have an adverse affect on uniformity. Therefore, it is desired to minimize reactive species cross-contamination between the processing stations, while providing for free flow of non-reactive species between the processing stations. By providing for free flow of non-reactive species between processing stations, a high degree of pressure equalization is achieved. A high degree of pressure equalization is required to achieve process control with both optimal and mirrored process results between adjacent processing regions. This limited or selective communication of process related products between processing regions is required, at least in part, so to maintain equal pressure in adjacent processing regions. The communication path at three sides of the partition arrangement maximizes isolation of gas reactive gaseous process related products and allows exchange of non-reactive gaseous process related products within the processing chamber. Equal pressure in the adjacent processing regions is required to assure that the process results achieved in one process region mirror those results obtained in the adjacent processing region when a single pressure control system (not shown), as is used here, is used to monitor and control chamber pressure. Partition arrangement 100 also cooperates with the chamber to provide another benefit. In particular, light is unable to travel between processing stations such that instrumentation that is responsive to such light is not affected in an adverse way. For example, process end point control is often established based on optical measurements. Light traveling from one process station to the other could then influence the process end point at the other processing station. Partition arrangement 100 cooperates with chamber 106 in a way which is intended to effectuate these purposes.

Still another advantage is provided by chamber arrangement 102 of system 100 with respect to the maintenance requirements of the system. It should be appreciated that such systems require significant levels of maintenance in order to maintain better than acceptable process results. In particular, cleaning of the processing chamber must be performed at regular intervals, generally based on operational time. It is not uncommon for such a cleaning procedure to be performed on a weekly basis. In this regard, it should be appreciated that there is very little free space surrounding processing stations 120 and 122 within the chamber, as is typical in such a system for reasons which include minimizing chamber interior space—a common practice in vacuum systems. Partition arrangement 160 is highly advantageous with respect to the capability to remove the partition arrangement during regular cleaning and maintenance of chamber 104, so as to significantly enhance access to the interior of the chamber. Moreover, the partition arrangement itself may readily be cleaned upon removal from the chamber. As an alternative, the partition arrangement may be disposed of and replaced by a new, clean partition arrangement. These features, in and by themselves, are considered to be highly advantageous.

Referring to FIG. 8, features which implement blocking of reactive species, while allowing a free flow of non-reactive species, include the circuitous gaps that are defined between partition arrangement edge 196a and rib 176 formed in chamber sidewall 150b and between partition arrangement edge 196b and rib 176 formed in chamber sidewall 150a.

Referring to FIG. 7 in conjunction with FIG. 8, another circuitous gap is defined between chamber lid 106 and upper margin 190 of the partition arrangement, as is described in detail above with regard to FIG. 7. It should be appreciated that the circuitous gaps that are defined along side margins 196a and 196b, along with the circuitous gap at upper margin 190 of the partition arrangement all serve to block reactive product species in regions of chamber 104, which contain relatively high concentrations of such reactive species proximate to processing stations 120 and 122. Moreover, with portions of these circuitous gaps in very close proximity to sources 132 and the processing stations, the probability of at least some reactive species impinging on these gaps in a way which would otherwise allow line-of-sight transit therethrough is considerable. The situation, however, proximate to the lower extents of partition arrangement 100, near chamber base 100, is somewhat modified. In this lower region, reactive species generally arrive with a high degree of angular orientation with respect to the plane of partition arrangement 100. For this reason, a sufficiently close clearance between each of edges 224, 226, 230, 232 and the confronted chamber surface, serves to block reactive species from transiting through these gaps. Another close tolerance gap is defined between a lowermost edge 249 of the partition arrangement and a baffle 250, as will be described in detail below. For the moment, however, it is noted that this gap is likewise sufficiently narrow so as to block transport of reactive species. The limited width of each gap cooperates with the thickness of the partition arrangement, in a confronting relationship with a chamber interior surface, and the angular impingement of reactive species in this region, so as to block these reactive species in a highly advantageous way. It is noted that conductance for purposes of pressure equalization is not required through the subject gaps, since the circuitous gaps around the sides and the upper margin of the partition arrangement are configured to supply ample conductance. Thus, from a practical standpoint, it may be considered that all process related products are blocked.

Referring again to FIG. 6, it can be seen that passage arrangement 240*a*, as described above, also defines a circuitous path between the processing stations which inhibits the flow of reactive species of therebetween. Concurrently, free flow of non-reactive species is permitted particularly when the passage arrangement is used for purposes such as instrumentation.

Turning now to FIGS. 8-10, another highly advantageous feature that is used in system 100 will now be described. FIG. 10 is a diagrammatic, perspective view of system 100 having a front portion of chamber 104 cut away in order to better illustrate those features which are currently of interest. In particular, aforementioned baffle 250 is visible in pump spool 144, forming part of the exhaust arrangement, in the view of FIG. 10. Baffle 250 is also seen in the elevational view of FIG. 8 and in the plan view of FIG. 9, comprising a generally planar plate-like member and may be formed, for example, from the same material that spool 144 is formed from including, but not limited to aluminum alloys. Baffle 250 may be installed in any suitable manner in pump spool 144 such as, for example, by welding. The baffle is positioned within the circular cross-section of the pump spool cavity, for example, in a way which defines a pair of opposing semicircular passages. An upper edge 252 (FIG. 10) of baffle 250 is vertically positioned so that the desired spaced apart relationship is achieved with lowermost edge 248 of partition arrangement 160, as is illustrated in FIG. 8. In this way, aside from the narrow gap between the lowermost partition edge and the upper edge of the baffle, baffle 250 essentially represents a continuation of partition arrangement 160 external to chamber 104, extending into exhaust arrangement 140. In the view of FIG. 9, the plane of baffle 250 is generally normal to and bisects a line drawn between the center positions of processing stations 120 and 122. In the present example, baffle 250 has an overall length that is greater than the length of pump spool 144 such that a portion 254 of baffle 250 extends into the exhaust system below pump spool 144. Thus, portion 254 of the pump spool baffle may extend into a component such as a pendulum valve (not shown) or other suitable valve. It is important, however, that portion 254 is sized lengthwise in a way which does not interfere with any component therebelow.

Baffle 250 has been found to enhance process uniformity for reasons which are thought to include minimization of communication of gaseous process exhaust products by reduction of back diffusion of gaseous process exhaust products from one process region to the adjacent process region in the exhaust system preceding the valve and vacuum pump (not shown) attached to the bottom of pump spool 144. In this regard, it should be noted that chamber 104 and partition arrangement 160, in and by themselves, cooperate, independent of baffle 250, to provide pressure equalization which serves to minimize back diffusion related contamination. Highly effective results have been demonstrated using baffle 250 in combination with the use of partition arrangement 100.

Generally considering system 100, the replaceability of partition arrangement 160 is advantageous for another reason. Initially, it should be appreciated that partition arrangement 160 establishes an exchange characteristic of the process related products between processing stations 120 and 122, when positioned therebetween. By replacing this partition arrangement with a modified partition arrangement, it should be appreciated that a modified exchange characteristic of the process related products can be established between the processing stations. The exchange characteristic may relate to mobility of the process related products. Further, the system may be operated without a partition arrangement.

Attention is now directed to FIG. 11 which illustrates system 100 in essentially the same view as that of aforedescribed FIG. 10, with the exception that partition arrangement 160 has been replaced by a modified partition arrangement 160'. Further, pump spool 144 has been replaced with a modified pump spool 144', which does not include a welded-in baffle. In this regard, modified partition arrangement 160' includes a chamber partition portion 260 and a baffle portion 262. Modified pump spool 144' includes a rail arrangement 264 having a pair of opposing rails, only one of which is visible in the view of this figure, that slidingly receives baffle portion 262, as the overall modified partition arrangement is inserted into the system. These rails, having a "C" or "U" shaped cross-sectional configuration, may cooperate with baffle portion 262 so as to define circuitous gaps between the confronting edges of the baffle portion and each rail. Modified partition arrangement 160' may be formed in any suitable manner such as, for example, having partition portion 260 integrally formed with baffle portion 262. Suitable materials for use in forming the modified partition arrangement include, but are not limited to aluminum alloys. Alternatively, separate pieces can be used for each of the baffle portion and the partition portion, attached to one another in a suitable manner such as, for example, by welding. It should be appreciated that the modified partition arrangement cooperates with chamber 104 in a way which shares all of the advantages described above. Still further advantages may be provided with regard to cleaning or replacing the baffle portion of the modified partition arrangement during maintenance as well as providing for ease of cleaning the interior of modified pump spool 144'. Although, it should be noted that contaminant build up in the pump spool is not generally considered to be as serious as contaminant build up within chamber 104, at least due to its more remote location from the processing stations.

Referring now to FIG. 12, an enlarged cross-sectional cut-away view is provided, taken through the thickness t of the partition arrangement, showing an alternative configuration of bottom edge 249 of partition arrangement 100. In this alternative configuration, a notch 280 is formed inward from lowermost edge 249 having a width w, which is less than the thickness of the partition arrangement, but greater than a thickness x of baffle 250. An upper edge 282 of baffle 250 is vertically positioned so as to either be coplanar with the remaining portions of bottom surface 249 of the partition arrangement or so that the baffle extends into notch 280 in a noncontacting manner. In this way, a circuitous path 284 can be defined between the partition arrangement and the baffle so as to function in the manner described above with respect to process related products.

Referring collectively to FIGS. 13a-d, a number of alternative configurations are diagrammatically illustrated for use in forming a circuitous gap between the partition arrangement and baffle. Conductance, for purposes of pressure equalization is not required through the partition/baffle interface, since the circuitous gaps around the sides and the upper margin of the partition arrangement are configured to supply ample conductance in view of the particular process that is being practiced. Further, minimizing the partition/baffle interface gap further reduces opportunities for diffusion-related exhaust backflow contamination. It is noted that the configurations of FIGS. 13a-d are conceptually applicable to forming a circuitous gap (see, for example, FIGS. 6 and 7) between chamber 104 and partition arrangement 160, in conjunction with the foregoing descriptions.

FIG. 13a illustrates partition arrangement 160 and baffle 250 (each of which is shown partially cutaway) cooperatively configured in a way which defines a semicircular gap 290. It is of interest to note that the thickness of the baffle can be equal to the thickness of the partition arrangement. It should also be appreciated that these configurations can be inverted with the understanding that particle collection could occur in the gap.

FIG. 13b illustrates partition arrangement 160 and baffle 250, in the manner of FIG. 13a, wherein baffle 250 is thinner than the partition arrangement and a rectangular notch 292 is defined from the lowermost edge of partition arrangement 160. This configuration resembles the configuration of FIG. 12 with the difference that an upper end portion 294 of the baffle extends into notch 292.

FIG. 13c illustrates partition arrangement 160 and baffle 250 (each of which is shown partially cutaway) having an identical thickness and cooperating to define therebetween a chevron shaped gap 296.

FIG. 13d illustrates partition arrangement 160 (shown partially cutaway) having a greater thickness than baffle 250 (shown partially cutaway) such that the partition arrangement defines an inverted V-shaped cavity 298. An upper end 300 of the baffle extends into cavity 298 and is configured to cooperate with a center portion of the inverted V shape so as to define a chevron shaped gap 302.

As will now be appreciated, a highly advantageous system is provided which accommodates high throughput without a need to resort to the use of a single process chamber environment by selectively controlling movement of individual components of process related products between process stations in a common/shared processing chamber and associated environment.

Although each of the aforedescribed physical embodiments have been illustrated with various components having particular respective orientations, it should be understood that the present invention may take on a variety of specific configurations with the various components being located in a wide variety of positions and mutual orientations. Furthermore, the methods described herein may be modified in an unlimited number of ways, for example, by reordering, modifying and recombining the various steps. Accordingly, it should be apparent that the arrangements and associated methods disclosed herein may be provided in a variety of different configurations and modified in an unlimited number of different ways, and that the present invention may be embodied in many other specific forms without departing from the spirit or scope of the invention. Therefore, the present examples and methods are to be considered as illustrative and not restrictive, and the invention is not to be limited to the details given herein.

What is claimed is:

1. An apparatus for processing workpieces in a treatment process, said apparatus comprising:
a multi-workpiece chamber including at least two processing stations, each of which is configured for exposing one of the workpieces to the treatment process and said chamber includes a chamber bowl that is configured for receiving a chamber lid in a closed position to seal a chamber interior when so received and said chamber bowl includes at least a first pair of opposing chamber sidewalls extending from a chamber base and each one of the first pair of the chamber sidewalls defines a slot that is transverse with respect to the chamber base to form a pair of opposing chamber slots; and
a partition that is configured to cooperate with said chamber such that the partition is disengagably removable from the chamber and, thereafter, re-engagable with the chamber for selectively dividing the processing stations from one another with the chamber supporting the partition and said partition cooperates with said chamber in a way that serves to equilibrate a process pressure between the first and second processing stations, said partition including a pair of opposing side margins such that that the partition is supportable in the chamber bowl, at least in part, having each one of the pair of opposing side margins at least partially received in each one of the pair of opposing chamber slots and in a spaced apart relationship from each respective one of the first pair of chamber sidewalls.

2. The apparatus of claim 1 wherein said process generates process related products that are introduced into said chamber and wherein said partition and said chamber are configured to cooperate with one another to provide only for non-line-of-sight travel between said processing stations such that certain ones of the process related products that are unable to travel non-line-of-sight are unable to move between said processing stations when the partition is engaged with the chamber.

3. The apparatus of claim 2 wherein said partition is configured to cooperate with said chamber to define a plurality of circuitous paths between the processing stations to provide only for said non-line-of-sight travel therealong such that other ones of the process related products, which can travel along a non-line-of-sight path, are able to move between the processing stations.

4. The apparatus of claim 3 wherein said other ones of the process related products include non-reactive species.

5. The apparatus of claim 3 wherein the certain ones of the process related materials include charged species.

6. The apparatus of claim 5 wherein said charged species include at least one of ions, electrons and radicals.

7. The apparatus of claim 1 wherein each side margin of the partition cooperates with one of the opposing chamber slots to define a gap configuration such that a non-line-of-sight path of travel is required in passing through said gap configuration from one processing station to the other processing station.

8. The apparatus of claim 7 wherein said partition includes an overall thickness and each side margin defines an outwardly extending elongated tab having a tab thickness that is less than said overall thickness and said elongated tab extends into one of said opposing chamber slots.

9. An apparatus for processing workpieces in a treatment process, said apparatus comprising:
- a multi-workpiece chamber including at least two processing stations, each of which is configured for exposing one of the workpieces to the treatment process and said chamber includes a chamber bowl that is configured for receiving a chamber lid in a closed position to seal a chamber interior when so received; and
- a partition that is configured to cooperate with said chamber such that the partition is disengagably removable from the chamber and, thereafter, re-engagable with the chamber for selectively dividing the processing stations from one another with the chamber supporting the partition wherein said chamber bowl cooperates with the partition for supporting the partition in a spaced apart relationship from the chamber lid when the chamber lid is in said sealed position and said partition includes an uppermost margin, nearest the chamber lid in said sealed position, and said uppermost margin cooperates with the lid to define a gap configuration such that a non-line-of-sight path of travel is required in passing through said gap configuration from one processing station to the other processing station.

10. The apparatus of claim 9 wherein said chamber lid defines a channel proximate to said uppermost margin of the partition such that at least a portion of the uppermost margin is at least partially received within said channel with the chamber lid in the sealed position.

11. The apparatus of claim 10 wherein said partition includes a first major side facing a first one of the processing stations and a second, opposite major side facing a second one of the processing stations when engaged with the chamber and having an overall thickness between the first and second major sides and said uppermost margin includes an elongated tab which projects toward the chamber lid in the closed position having a tab thickness that is less than said overall thickness such that the tab thickness is received in said channel.

12. The apparatus of claim 11 wherein said elongated tab is inset with respect to each of said first and second major sides of the main body along said uppermost margin of the partition.

13. An apparatus for processing workpieces in a treatment process, said apparatus comprising:
- a multi-workpiece chamber including at least two processing stations, each of which is configured for exposing one of the workpieces to the treatment process and said chamber includes a chamber bowl that is configured for receiving a chamber lid in a closed position to seal a chamber interior when so received wherein said chamber defines an exhaust port that is at least generally between the processing stations and including an exhaust arrangement that is connected to said exhaust port to define an exhaust channel to support an exhaust flow for use in evacuating said chamber; and
- a partition that is configured to cooperate with said chamber such that the partition is disengagably removable from the chamber and, thereafter, re-engagable with the chamber for selectively dividing the processing stations from one another with the chamber supporting the partition and wherein said partition includes a baffle portion that extends outward from said exhaust port and into said exhaust channel in a way which divides the exhaust flow into at least two exhaust flow portions that leave said multi-workpiece chamber in a way which enhances uniformity of said treatment process for the first and second workpiece stations.

* * * * *